(12) United States Patent
Chen et al.

(10) Patent No.: US 7,231,617 B2
(45) Date of Patent: Jun. 12, 2007

(54) DETERMINATION OF GRAIN SIZES OF ELECTRICALLY CONDUCTIVE LINES IN SEMICONDUCTOR INTEGRATED CIRCUITS

(75) Inventors: Fen Chen, Williston, VT (US); Jeffrey P. Gambino, Westford, VT (US); Jason P. Gill, Essex Junction, VT (US); Baozhen Li, South Burlington, VT (US); Timothy D. Sullivan, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 10/711,418

(22) Filed: Sep. 17, 2004

(65) Prior Publication Data

US 2006/0071676 A1    Apr. 6, 2006

(51) Int. Cl.
*G06F 17/50* (2006.01)
(52) U.S. Cl. .......................................... 716/4
(58) Field of Classification Search ..................... 716/4
See application file for complete search history.

(56) References Cited

U.S. PATENT DOCUMENTS

| 6,603,321 B2 | 8/2003 | Filippi, Jr. et al. |
| 2001/0046276 A1 | 11/2001 | Schneider et al. |

OTHER PUBLICATIONS

Schmidt, J., et al., "A possible technique for determining the average grain sizein thin granular superconducting films", Mar. 1987, IEEE, IEEE Transactions on Magnetics, vol. 23, Issue 2. pp. 1034-1036.*
Using the Temperature Coefficient of the Resistance (TCR) as Early Reliability Indicator for Stressvoiding Risks in CU Interconnects, by A. von Glasow et al., Copyright 2003, pp. 126-131.

\* cited by examiner

*Primary Examiner*—Stacy A Whitmore
(74) *Attorney, Agent, or Firm*—Schmeiser, Olsen & Watts; Anthony J. Canale

(57) ABSTRACT

Novel structures and methods for evaluating lines in semiconductor integrated circuits. A first plurality of lines can be formed on a wafer each of which comprises multiple line sections. All the line sections are of the same length. The electrical resistances of the line sections are measured. Then, a first line geometry adjustment is determined based on the electrical resistances of all the sections of all the lines. The first line geometry adjustment represents an effective reduction of cross-section size of the lines due to grain boundary electrical resistance. A second plurality of lines of same length and thickness can be formed on the same wafer. Then, second and third line geometry adjustments can be determined based on the electrical resistances of these lines measured at different temperatures. The second and third line geometry adjustments represent an effective reduction of cross-section size of the lines due to grain boundary electrical resistance and line surface roughness.

6 Claims, 4 Drawing Sheets

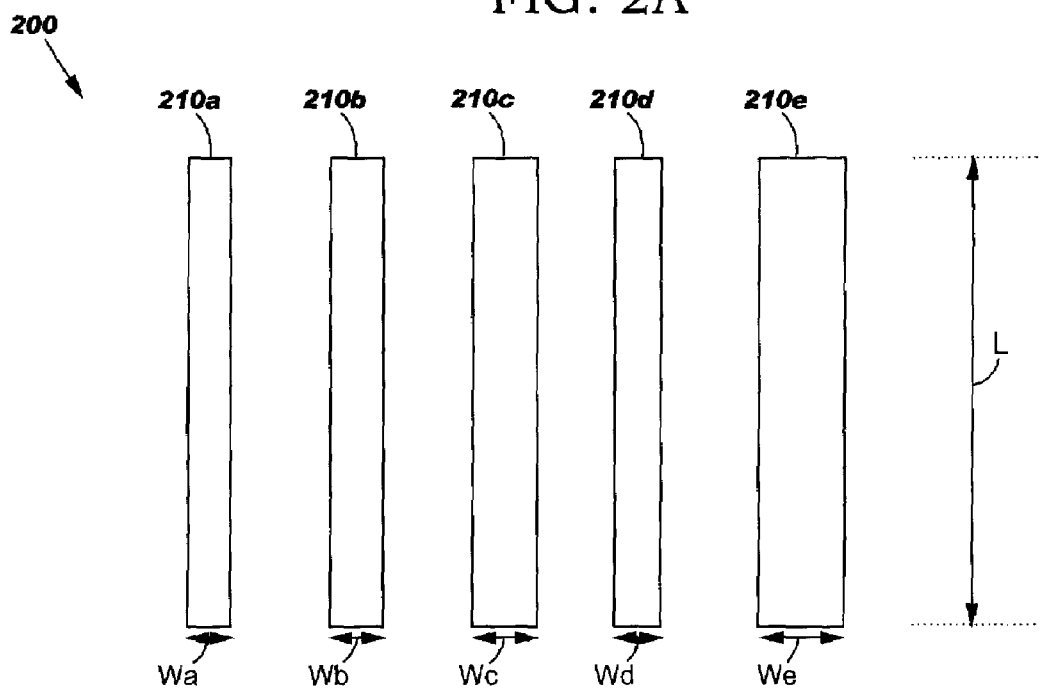

DETERMINATION OF GRAIN SIZES OF ELECTRICALLY CONDUCTIVE LINES IN SEMICONDUCTOR INTEGRATED CIRCUITS

BACKGROUND OF THE INVENTION

1. Technical Field

The present invention relates to semiconductor integrated circuits, and more particularly, to the non-destructive evaluation of electrically conducting lines in semiconductor integrated circuits.

2. Related Art

As dimensions reach the deep-submicron level on the order of the mean-free path of electrons of Cu interconnect wires, the size effect on the resistivity of Cu interconnects corresponding to reductions of wire dimensions becomes more significant. While advances in development of integrated circuits continue to lead to higher conductivity Cu and lower effective dielectric constant (k) insulation layer, the size effect in reduced geometries can degrade the benefit of small RC delay provided by Cu and low-k insulation layers. Three types of extra electron scattering mechanisms due to the size effect in addition to the isotropic background scattering were verified. These three scattering mechanisms including scattering at the grain boundaries, diffuse scattering at the external surfaces, and the surface roughness induced scattering deviations, were simultaneously operative in interconnect thin films. For interconnect lines in deep sub-micron regime, electron scattering from the surface and aggravated by line surface roughness and grain boundary is the dominant reason for significantly increasing of wire resistance. Therefore, it is important to control and monitor line surface roughness and line grain boundary resistance to minimize such additional electron scatterings. Besides resistivity increase due to line surface roughness and grain boundary resistance, line long-term reliability such as electromigration (EM) and stress migration (SM) is also dependent on surface roughness and grain distributions. EM mass transport and SM void diffusion usually are very sensitive to surface/interface conditions and grain size. Presently, there is no any simple, non-destructive methodology available to monitor integrated line surface quality and grain size/boundary configuration for manufacture process monitoring, in-line characterization, or reliability pre-screening.

Therefore, there is a need for novel structures and methods for evaluating the impacts of grain boundary electrical resistance and line surface roughness on interconnect line electrical resistance and reliability.

SUMMARY OF THE INVENTION

The present invention provides a method for grain size determination, the method comprising the steps of (a) providing an electrically conducting line including N sections of equal length, wherein N is an integer greater than 1; (b) measuring N electrical resistances respectively corresponding to the N sections; (c) determining a number of grains in the line based on the N measured electrical resistances of the N sections; and (d) determining an average grain size of the line based on a length of the line and the number of grains in the line.

The present invention also provides a method of line evaluation, comprising the steps of (a) providing a line evaluation structure comprising N electrically conducting lines, wherein N is a positive integer, wherein, for i=1, 2, ... ,N, the $i^{th}$ line of the N electrically conducting lines comprises $M_i$ line sections, $M_i$ being a positive integer, such that the N electrically conducting lines comprise in total S line sections, wherein $S=\Sigma M_i$ (i=1,2, ... ,N), wherein each line section of the S line sections is of the same length, and (b) measuring electrical resistance of each line section of the S line sections; and (c) determining a line geometry adjustment for the line evaluation structure based on the electrical resistances of the S line sections obtained in step (b), wherein the line geometry adjustment represents an effective reduction of cross-section size of the N electrically conducting lines as a result of grain boundary electrical resistance.

The present invention also provides a method of line evaluation, comprising the steps of (a) providing a line evaluation structure comprising N electrically conducting lines of a same length and a same thickness, wherein N is a positive integer, wherein the N electrically conducting lines have M different line widths, wherein M is a positive integer and M≦N, and wherein each line of the N electrically conducting lines is configured to be measured for electrical resistance; (b) for each temperature of P different temperatures and for each line width of the M line widths, measuring an electrical resistance for the line width at the temperature, wherein P is an integer greater than 1; (c) for each line width of the M line widths, determining a temperature coefficient of electrical resistance (TCR) based on the P electrical resistances at P temperatures for the line width; (d) determining first and second line geometry adjustments for the N electrically conducting lines based on the M TCRs of the M line widths determined in step (c), wherein the first line geometry adjustment represents an effective reduction of line width of the N electrically conducting lines as a result of grain boundary electrical resistance and sidewall surface roughness of the N electrically conducting lines, and wherein the second line geometry adjustment represents an effective reduction of thickness of the N electrically conducting lines as a result of grain boundary electrical resistance and top/bottom surface roughness of the N electrically conducting lines.

The present invention provides novel structures and methods for evaluating the impacts of grain boundary electrical resistance and line surface roughness on interconnect line electrical resistance.

BRIEF DESCRIPTION OF THE DRAWINGS

FIGS. 2A–2B show a structure and a method for determining line geometry adjustments δ and θ due to both grain boundary electrical resistance and line surface roughness for a line fabrication process, in accordance with embodiments of the present invention.

DETAILED DESCRIPTION OF THE INVENTION

Figure 1A:
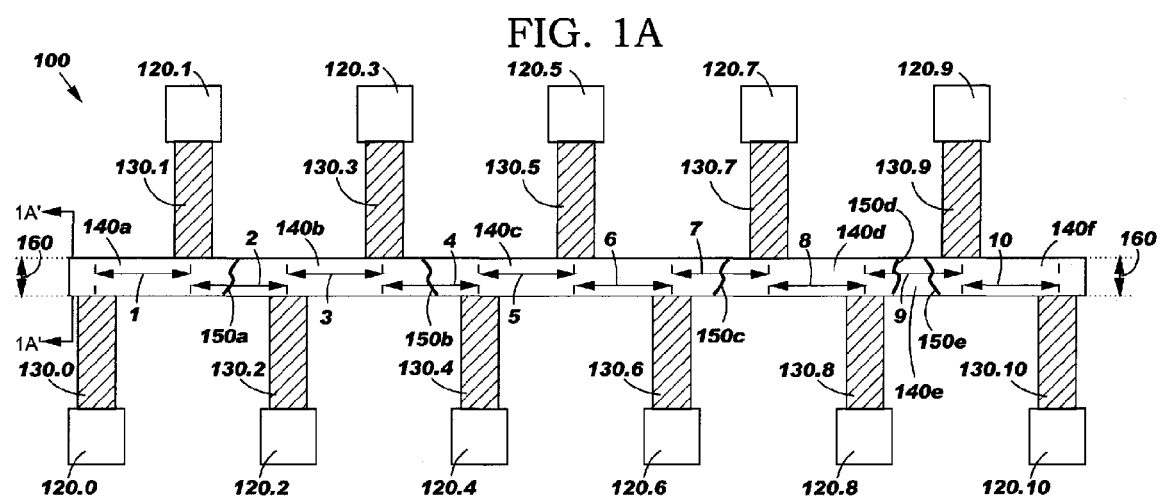
FIGS. 1A–1D show a structure and a method for determining (a) line grain boundary electrical resistance $R_b$, (b) line geometry adjustment $\epsilon$ due to grain boundary electrical resistance for a line fabrication process and (c) the average grain size for a line width for the line fabrication process, in accordance with embodiments of the present invention.
Figure 1A:
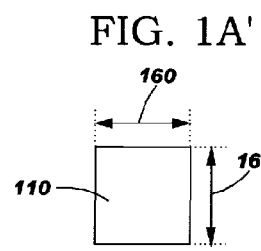

FIG. 1A shows a top view of a macro 100 comprising a conducting line 110 used for (a) determining line geometry adjustment ∈ for the macro 100 due to grain boundary electrical resistance and (b) estimating the average grain size of the grains of the line 110, in accordance with embodiments of the present invention. More specifically, the line geometry adjustment ∈ represents an effective reduction of cross-section size (thickness and line width) of a line as a result of grain boundary electrical resistance.

In one embodiment, for illustration, the macro 100 can comprise the conducting line 110, eleven pads 120.0–120.10 (collectively referred to as pads 120) and eleven coupling lines 130.0–130.10 (collectively referred to as coupling lines 130) that electrically couple the pads 120 to the line 110. More specifically, the coupling line 130.$i$ electrically couples the pad 120.$i$ to the line 110, wherein i=0–10. In one embodiment, the points at which the 11 coupling lines 130 contact the line 110 divide the line 110 into 10 line sections 1, 2, . . . , and 10 of equal length. In one embodiment, the macro 100 can be formed in a wafer (not shown) during the fabrication of other devices (not shown) on the same wafer.

In one embodiment, the pads 120 can be formed at the same interconnect level as the conducting line 110. Alternatively, the pads 120 can be formed at interconnect levels higher than the level of the conducting line 110.

Assume that the conducting line 110 comprises, illustratively, 6 grains 140$a$, . . . , and 140$f$ (collectively referred to as the grains 140) and 5 grain boundaries 150$a$, . . . , and 150$e$. Assume further that the conducting line 110 has a line width 160 that is smaller than the average grain size of the grains 140.

Figure 1C:
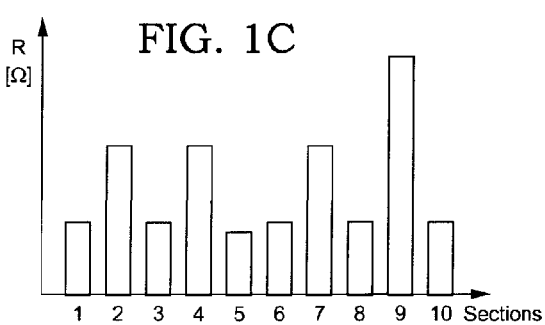
Figure 1D:
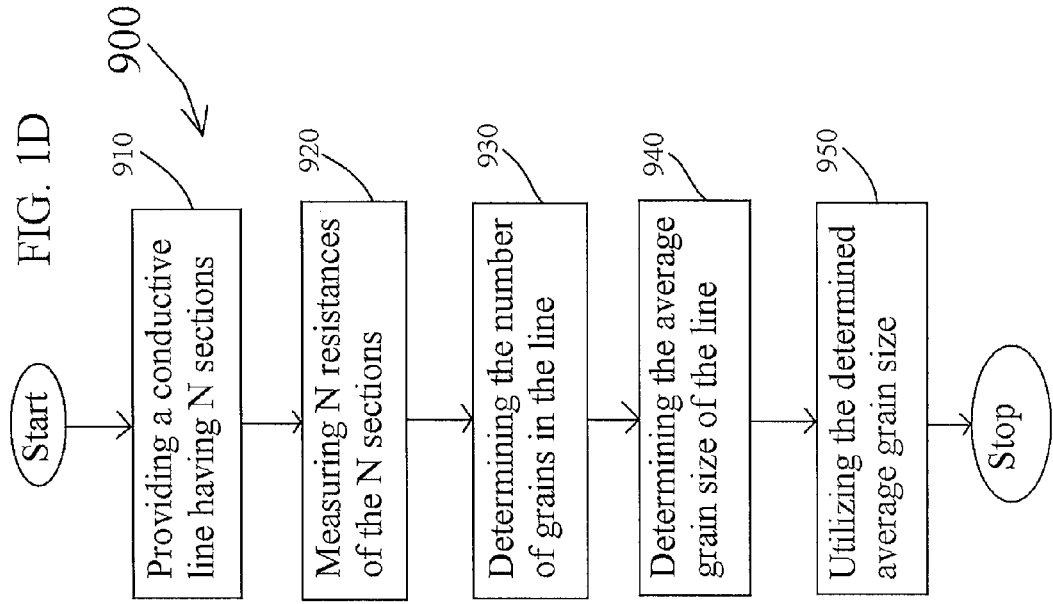
Figure 1B:
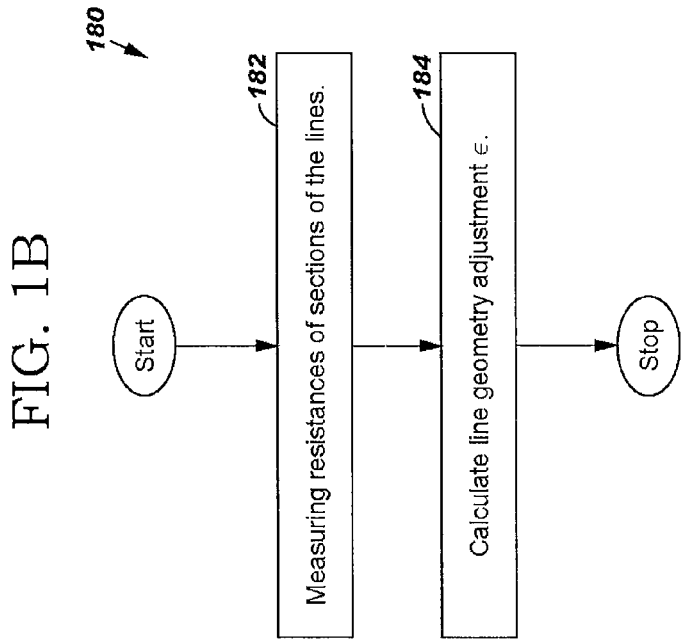

FIG. 1B shows a flow chart of a method 180 for determining the line grain boundary resistance $R_b$ and geometry adjustment ∈ due to grain boundary electrical resistance for the macro 100 (and therefore, also for the line fabrication process that forms the macro 100 and other devices on the same wafer as the macro 100). In one embodiment, the method 180 starts with a step 182 of measuring the electrical resistances of the sections 1, 2, . . . , and 10 of the line 110 using any known method (e.g., the 4-point Kelvin measurement method). The pads 120 can be used as contact points by the measuring device. As a result, ten electrical resistance values are obtained for the ten sections 1, 2, . . . , and 10 of the line 110.

Next, in one embodiment, in step 184, the line geometry adjustment ∈ can be determined by analyzing the ten electrical resistance values obtained in step 182. More specifically, ∈ can be extracted from the following equation:

$$R(\text{no } GB)/R_b(\text{one } GB) = (w-∈)*(h-∈)/(w*h) \quad (1)$$

wherein:

R(no GB) is the average section electrical resistance of the sections containing no GB (grain boundary).

$R_b$ (one GB) is the average section electrical resistance of the sections containing only one GB.

w and h are line width 160 and line thickness 162 (FIG. 1A', which shows a cross-section view along a line 1A'—1A' of the line 110 of FIG. 1A) of the line 110, respectively, which are both known.

In one embodiment, the sections of the line 110 that contain no grain boundary and the sections of the line 110 that contain only one grain boundary can be identified by depicting the ten section electrical resistances of the ten sections 1, . . . , and 10 on a same graph with each section electrical resistance represented by a vertical bar (FIG. 1C). It should be clear from FIG. 1C that the ten section electrical resistances can be divided into groups of similar section electrical resistances.

For instance, the electrical resistances of the sections 1, 3, 5, 6, 8, and 10 are similar and are the lowest. Therefore, it can be inferred that the respective sections 1, 3, 5, 6, 8, and 10 contain no grain boundary. As a result, the average section electrical resistance of the sections 1, 3, 5, 6, 8, and 10 can be used as R(no GB) in equation (1) above.

Similarly, the electrical resistances of the sections 2, 4, and 7 are similar and are the next-higher. Therefore, it can be inferred that the respective sections 2, 4, and 7 contain only one grain boundary. As a result, the average section electrical resistance of the sections 2, 4, and 7 can be used as $R_b$ (one GB) in equation (1) above.

In practice, not all grain boundaries are expected to have the same resistance, but will instead have a range of resistances. Nevertheless, the values of resistance obtained are expected to fall with definable groups or distributions which have mean values that can be treated in the same manner indicated above.

With w and h known and R(no GB) and $R_b$ (one GB) obtained as described supra, line geometry adjustment ∈ can be extracted from equation (1) above. The resulting line geometry adjustment ∈ gives the process engineer an idea about the quality of the line 110 of the macro 100, and therefore gives the process engineer a general idea about the quality of the process that forms the line 110. More specifically, the line geometry adjustment ∈ indicates that if a line section contains one grain boundary and has thickness h and line width w, then the line section is equivalent to (i.e., has the same electrical resistance as) another line section that contains no grain boundary and has thickness h−∈ and line width w−∈. In other words, line geometry adjustment ∈ represents an effective reduction of cross-section size of the line 110 as a result of grain boundary electrical resistance.

In an alternative embodiment, instead of comprising only one line 110 as described above, the macro 100 can comprise multiple lines (not shown) similar to the line 110 (i.e., having the same thickness and section length), but having different line widths. In one embodiment, the lengths of these lines may be different. The inventors of the present invention have found that although grain size may change with line width and fabrication process conditions, the average grain size is known to be in the range of 0.3–0.7 μm for a normal Cu metallurgy process. As a result, in one embodiment, the line 110 can comprise conducting lines (not shown) some of which have line widths smaller than the average grain size (i.e., bamboo structures) and some of which have line widths larger than the average grain size. For instance, for illustration, the macro 100 can comprise 11 conducting lines (not shown) having the following 11 different line widths: 0.1 μm, 0.3 μm, 0.5 μm, 0.7 μm, 1 μm, 1.5 μm, 2 μm, 3 μm, 5 μm, 7 μm, and 10 μm.

Then, the step 182 of the method 180 (FIG. 1B) can be performed for each of the 11 lines of the macro 100 (i.e., measuring electrical resistances of the sections of each of the 11 lines of the macro 110). Although the lines having line widths above 0.7 μm are not useful to effectively detect grain boundary electrical resistance under normal process condition, this multiple line width macro 100 will guarantee to cover all different grain sizes and even abnormal grain size cases due to abnormal process.

Then, in one embodiment, the step 184 (FIG. 1B) can be performed as if all the section electrical resistances obtained in step 182 came from one conducting line. More specifically, in equation (1), R(no GB) can be obtained by averaging the similar, lowest section electrical resistances of the section electrical resistances. $R_b$ (one GB) can be obtained by averaging the similar, next-higher section electrical resistances of the section electrical resistances. w can be the line width closest to but lower than the average grain size (i.e., w=0.5 micron). h can be the common thickness of the 11 conducting lines, which is known. As a result, the resulting line geometry adjustment ∈ extracted from equation (1) is applicable to the entire macro 100 comprising 11 lines of same thickness h but different line widths.

In one embodiment, the macro 100 comprising 11 lines can be used to electrically estimate an average grain size for each of the 11 lines. More specifically, by examining the section electrical resistances of each line, the average grain size for that line can be roughly estimated. In one embodiment, the average grain size for a line can be estimated by dividing the length of the line (which can be represented by the number of sections of the line) by the number of detected grains in the line.

For example, assume that the line 110 (FIG. 1A) is one of the 11 lines of the macro 100. The number of sections of line 110 is known (i.e., 10 sections). The six grains 140 can be detected by using the graph of FIG. 1C. It could be inferred from FIG. 1C that there are no grain boundary in sections 1, 3, 5, 6, 8, and 10; one grain boundary in each of sections 2, 4, and 7; and two grain boundaries in section 9 of the line 110. In other words, there are 5 grain boundaries and, therefore, 6 grains in the line 110. As a result, the average grain size for line 110 can be determined by dividing the length of the line (i.e., 10 sections, if measured in terms of number of sections) by the number of detected grains in the line 110 (i.e., 6 grains).

In one embodiment, the above steps can be repeated for the other 10 different lines. The 11 lines have 11 different line widths. As a result, the average grain size of each particular line also represents the average grain size for the associated line width. Average grain size is one of the key parameters that need to be closely monitored during manufacturing process, interconnect research, and material development. FIG. 1D summarizes the steps of a method 900 for determining an average grain size. More specifically, in step 910, the line 110 (FIG. 1A) is formed having N sections of equal lengths. Next, in step 920, the resistances of the N sections are measured. Next, in step 930, the number of grains in the line 110 is determined. Next, in step 940, the average grain size of the line 110 is determined. Finally, in step 950, the average grain size is utilized in a manufacturing process, an interconnect research process, or a material development process.

In one embodiment, the macro 100 can be formed in a chip. As a result, $\in$ can represent line quality of the chip. If $\in$ of the chip exceeds a pre-specified value $\in_o$, the process engineer can determine that the conducting lines in the chip have too high electrical resistance due to excessive grain boundary electrical resistance and therefore the chip should be marked as defective. Similarly, in one embodiment, if an average grain size of a line of the macro 100 does not fall in a pre-specified range (either too small or too large), the process engineer can determine that the conducting lines in the chip are possibly mis-processed and therefore the chip should be marked as defective.

FIG. 2A shows a top view of a macro 200 used for determining line geometry adjustments δ and θ due to both grain boundary electrical resistance and line surface roughness for the lines of the macro 200, in accordance with embodiments of the present invention. In one embodiment, the line geometry adjustment δ represents an effective reduction of line width of the lines of the macro 200 as a result of grain boundary electrical resistance and sidewall surface roughness of the lines of the macro 200. The line geometry adjustments θ represents an effective reduction of thickness of the lines of the macro 200 as a result of grain boundary electrical resistance and top/bottom surface roughness of the lines of the macro 200.

In one embodiment, for illustration, the macro 200 can comprise five conducting lines 210a, . . . , 210e having the same length L and same thickness H (not shown) but having five different line widths Wa, Wb, Wc, Wd, and We, respectively.

In one embodiment, the macro 200 can be formed in a wafer (not shown) during the fabrication of other devices (not shown) in the same wafer.

Figure 2B:
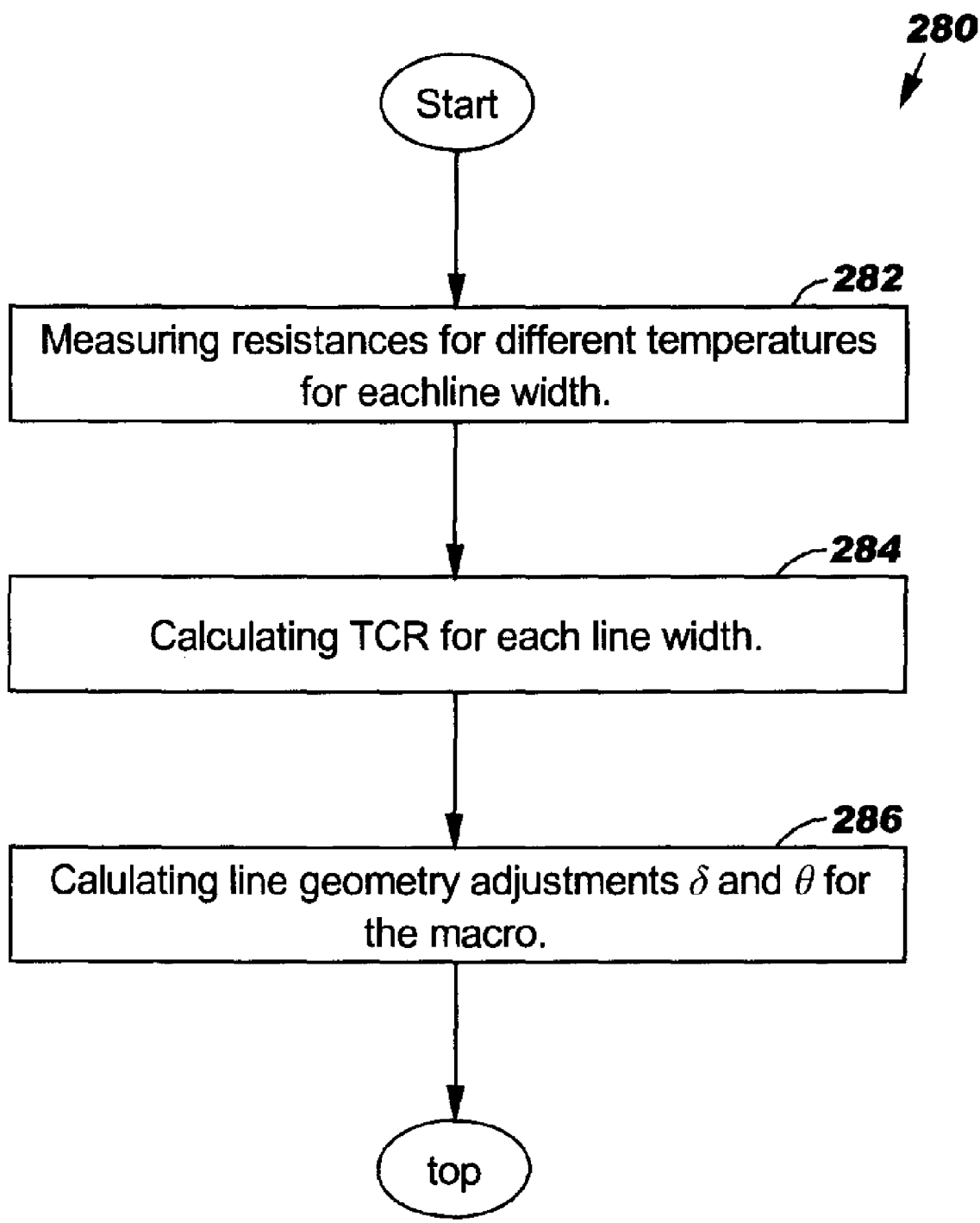

FIG. 2B shows a flow chart of a method 280 for determining the line geometry adjustments δ and θ for the conducting lines 210a, . . . , 210e of the macro 200. In one embodiment, the method 280 starts with a step 282 of measuring the electrical resistances of the conducting lines 210a, . . . , 210e at different temperatures using any known electrical resistance measuring method. Illustratively, the electrical resistances of the conducting lines 210a, . . . , 210e can be measured at three different temperatures such as 30° C., 45° C., and 60° C. As a result, 15 electrical resistance values are obtained for the five conducting lines 210a, . . . , 210e. In step 282, assume that the conducting lines 210a, . . . , 210e have measured electrical resistances Ra1, Rb1, Rc1, Rd1, and Re1 at temperature T1=30° C., respectively; have measured electrical resistances Ra2, Rb2, Rc2, Rd2, and Re2 at temperature T2=45° C., respectively; and have measured electrical resistances Ra3, Rb3, Rc3, Rd3, and Re3 at temperature T3=60° C., respectively.

Next, in step 284, in one embodiment, for each of the five different line widths Wa, Wb, Wc, Wd, and We, a TCR (temperature coefficient of electrical resistance) is determined. More specifically, in one embodiment, the TCR of line width Wa (hereafter referred to as TCRa) can be obtained by curve-fitting a straight line having the following equation $$R=Ro*[1+TCRa*(T-To)] \qquad (2)$$

to three points (T1, Ra1); (T2, Ra2); and (T3, Ra3) on an orthogonal x-y axis system having horizontal T-axis and vertical Ra-axis, wherein T is temperature variable, R is electrical resistance variable for the line width, TCRa is the temperature coefficient of electrical resistance of the line width, (To,Ro) is a point on the straight line, and Ra is electrical resistance of line 210a. In one embodiment, the least-square curve fit method can be used.

From the resulting curve-fit straight line, TCRa can be determined. More specifically, in one embodiment, assume the curve-fit straight line cuts the three vertical lines T=T1, T=T2, and T=T3 at three points (T1, Ra1'); (T2, Ra2'); and (T3, Ra3'), respectively. Then (T1, Ra1') can be used as the reference point (To,Ro) and (T2, Ra2') can be plugged into the equation (2). As a result, $$TCRa=(1/Ra1')*[(Ra2'-Ra1')/(T2-T1)]=(1/Ra1')*k, \qquad (2a),$$

wherein k is the slope of the resulting curve-fit straight line.

Depending on which pair of three points (T1, Ra1'); (T2, Ra2'); and (T3,Ra3') is used in equation (2), the formula for TCRa can change. There are two other formulas for TCRa:

$$TCRa(1/Ra2')*k \qquad (2b),$$

and $$TCRa(1/Ra3')*k \qquad (2c).$$

Either (2a), (2b), or (2c) can be used to determine TCRa because Ra1', Ra2', and Ra3' are approximately equal. In one embodiment, the average value of Ra1', Ra2', and Ra3' can be used in place of Ra1', Ra2', and Ra3' in equations (2a), (2b), or (2c), respectively.

In one embodiment, TCRb, TCRc, TCRd, and TCRe can be obtained in a similar manner for the line widths Wb, Wc, Wd, and We, respectively.

Next, in step 286, in one embodiment, the line geometry adjustments δ and θ for the lines 210a, . . . , 210e can be obtained by first depicting five points (Wa, TCRa); (Wb, TCRb); (Wc, TCRc); (Wd, TCRd); and (We, TCRe) on an orthogonal x-y axis plane having horizontal line width W-axis and vertical TCR-axis. Then, a curve $$TCR = TCRo*(W-\delta)*(H-\theta)/(W*H), \quad (3)$$

is curve-fitted to the five points (Wa, TCRa); (Wb, TCRb); (Wc, TCRc); (Wd, TCRd); and (We, TCRe), wherein:

TCRo is the bulk TCR of the material of the conducting lines 210a, . . . , 210e, which is known.

H is the common thickness of the conducting lines 210a, . . . , 210e, which is known.

δ and θ are two constant parameters to be obtained.

TCR and W are temperature coefficient of electrical resistance and line width, respectively, which are variables.

In one embodiment, the least-square curve fit method can be used. As a result of this curve-fitting step, δ and θ can be determined for the macro 200.

In one embodiment, line geometry adjustment pw due to sidewall surface roughness can be defined as pw=δ−∈. Similarly, line geometry adjustment ph due to top/bottom surface roughness can be defined as ph=θ−∈.

In one embodiment, multiple macros (not shown) like the macro 200 (FIG. 2A) can be formed (i.e., embedded) in different chips (not shown) across a wafer (not shown). For each of such macros, a pair of δ and θ can be obtained using the method 280 (FIG. 2B) described above, and then a pair of pw and ph are obtained using the formulas pw=δ−∈ and ph=θ−∈, wherein ∈ can be obtained for the entire wafer using method 180 (FIG. 1B) described above. Then, pw, ph, and ∈ can be plotted across the wafer to help a process engineer evaluate the quality of the conducting lines in different chips across the wafer.

In one embodiment, if pw of a chip exceeds a pre-specified value $pw_o$, the process engineer can determine that the conducting lines in the chip are too small due to excessive sidewall surface roughness and therefore the chip should be marked as defective. Similarly, if ph of a chip exceeds a pre-specified value $ph_o$, the process engineer can determine that the conducting lines in the chip are too small due to excessive top/bottom surface roughness and therefore the chip should be marked as defective.

In the embodiments described above, the macro 100 (FIG. 1A) has one line for each line width. In general, there can be more than one line for each line width in the macros 100 and 200.

In the embodiments described above with respect to FIG. 2A, there is only one conducting line corresponding to a line width. In general, there can be more than one conducting line for each line width. If so, the electrical resistance for the line width at a temperature can be determined by averaging the electrical resistances of the lines of that line width at that temperature.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for grain size determination, the method comprising the steps of:
   (a) providing an electrically conductive line including N sections of equal length, wherein N is an integer greater than 1;
   (b) measuring N electrical resistances respectively corresponding to the N sections;
   (c) determining a number of grains in the line based on the N measured electrical resistances of the N sections;
   (d) determining an average grain size of the line based on a length of the line and the number of grains in the line, and
   (e) using the determined average grain size in a process selected from the group consisting of a manufacturing process, an interconnect research process, and a material development process.

2. The method of claim 1, wherein the step (c) comprises the steps of:
   determining a number of grain boundaries in each section of the N sections of the line based on the N measured electrical resistances of the N sections;
   determining a total number of grain boundaries in the line based on the number of grain boundaries in each section of the N sections of the line; and
   determining the number of grains in the line based on the total number of grain boundaries in the line.

3. The method of claim 2, wherein the step of determining the number of grain boundaries in each section of the N sections of the line based on the N measured electrical resistances of the N sections comprises the steps of:
   grouping the N measured electrical resistances of the N sections into M groups of similar electrical resistances, wherein M is an integer greater than or equal to 1 but less than N;
   identifying a first group of the M groups that contain the lowest, similar electrical resistances, a second group of the M groups that contain the next-higher, similar electrical resistances, . . . , and an $M^{th}$ group that contain the highest, similar electrical resistances;
   determining a number of grain boundaries for each group of the M groups, wherein the number of grain boundaries for the group represents the number of grain boundaries in a section of the N sections whose associated electrical resistance is in the group; and
   determining the number of grain boundaries in each section of the N sections based on the number of grain boundaries for the group that contains the electrical resistance of the section.

4. The method of claim 3, wherein the step of determining the number of grain boundaries for each group of the M groups comprises the step of determining that the number of grain boundaries for the first group is zero.

5. The method of claim 2, wherein the step of determining the number of grains in the line based on the total number of grain boundaries in the line comprises the step of adding one to the total number of grain boundaries in the line to obtain the number of grains in the line.

6. The method of claim 1, further comprising the steps of determining that a chip that contains the line is defective if the average grain size of the line is not within a pre-specified range.

* * * * *